United States Patent
Kittler et al.

(10) Patent No.: US 8,759,169 B2
(45) Date of Patent: Jun. 24, 2014

(54) METHOD FOR PRODUCING SILICON SEMICONDUCTOR WAFERS COMPRISING A LAYER FOR INTEGRATING III-V SEMICONDUCTOR COMPONENTS

(75) Inventors: Gabriel Kittler, Ilmenau (DE); Ralf Lerner, Erfurt (DE)

(73) Assignee: X—FAB Semiconductor Foundries AG, Erfurt (DE)

( * ) Notice: Subject to any disclaimer, the term of this patent is extended or adjusted under 35 U.S.C. 154(b) by 25 days.

(21) Appl. No.: 13/504,197

(22) PCT Filed: Nov. 2, 2010

(86) PCT No.: PCT/EP2010/066642
§ 371 (c)(1),
(2), (4) Date: Jul. 10, 2012

(87) PCT Pub. No.: WO2011/051499
PCT Pub. Date: May 5, 2011

(65) Prior Publication Data
US 2012/0270378 A1    Oct. 25, 2012

(30) Foreign Application Priority Data
Oct. 31, 2009    (DE) .......................... 10 2009 051 520

(51) Int. Cl.
*H01L 21/338*    (2006.01)

(52) U.S. Cl.
USPC .... 438/172; 438/167; 257/194; 257/E29.246; 257/E21.403; 257/E21.407

(58) Field of Classification Search
USPC .................. 438/172, 167; 257/194, E21.403, 257/E29.246
See application file for complete search history.

(56) References Cited

U.S. PATENT DOCUMENTS

| | | | |
|---|---|---|---|
| 4,753,896 A * | 6/1988 | Matloubian | 438/149 |
| 7,078,318 B2 | 7/2006 | Jürgensen et al. | |
| 7,420,226 B2 | 9/2008 | Augustine et al. | |
| 7,700,416 B1 * | 4/2010 | Clifton et al. | 438/142 |
| 7,851,325 B1 * | 12/2010 | Gaines et al. | 438/424 |
| 7,972,916 B1 * | 7/2011 | Connelly et al. | 438/197 |

(Continued)

FOREIGN PATENT DOCUMENTS

| | | |
|---|---|---|
| DE | 10146888 C1 | 4/2003 |
| DE | 10206750 A1 | 7/2003 |

(Continued)

OTHER PUBLICATIONS

Kendall, D.L.; Vertical Etching of Silicon at Very High Aspect Ratios; Annual Review of Materials Science; Annual Reviews Inc.; vol. 9; Jan. 1, 1979; pp. 373-403; XP000577655; ISSN: 0084-6600, Palo Alto, CA, US.

(Continued)

*Primary Examiner* — Telly Green
(74) *Attorney, Agent, or Firm* — Stevens & Showalter, LLP

(57) ABSTRACT

The invention relates to a method for producing silicon semiconductor wafers and components having layer structures of III-V layers for integrating III-V semiconductor components. The method employs SOI silicon semiconductor wafers having varying substrate orientations, and the III-V semiconductor layers are produced in trenches (28, 43, 70) produced by etching within certain regions (38, 39), which are electrically insulated from each other, of the active semiconductor layer (24, 42) by means of a cover layer or cover layers (29) using MOCVD methods.

19 Claims, 7 Drawing Sheets

(56) References Cited

U.S. PATENT DOCUMENTS

| | | | |
|---|---|---|---|
| 8,003,486 B2 * | 8/2011 | Gaines et al. | 438/424 |
| 2003/0064591 A1 | 4/2003 | Lutzen et al. | |
| 2005/0025909 A1 | 2/2005 | Jurgensen et al. | |
| 2005/0026392 A1 | 2/2005 | Jurgensen et al. | |
| 2006/0284247 A1 | 12/2006 | Augustine et al. | |
| 2007/0048975 A1 | 3/2007 | Chen et al. | |
| 2007/0105256 A1 | 5/2007 | Fitzgerald | |
| 2007/0105274 A1 | 5/2007 | Fitzgerald | |
| 2007/0105335 A1 | 5/2007 | Fitzgerald | |
| 2007/0290263 A1 | 12/2007 | Kamata | |
| 2008/0153267 A1 | 6/2008 | Clavelier et al. | |
| 2009/0067463 A1 | 3/2009 | Barwicz et al. | |
| 2010/0133658 A1 | 6/2010 | Dadgar et al. | |
| 2011/0092047 A1 * | 4/2011 | Gaines et al. | 438/424 |

FOREIGN PATENT DOCUMENTS

| | | |
|---|---|---|
| DE | 10219223 A1 | 7/2003 |
| WO | 2006138378 A1 | 12/2006 |
| WO | 2008099246 A2 | 8/2008 |
| WO | 2008132204 A2 | 11/2008 |

OTHER PUBLICATIONS

Stanley Wolf; Dry Etching for ULSI Fabrication; Silicon Processing for the VLSI Era; Jan. 1, 1999; pp. 655-718; XP009127569.

Stanley Wolf; Silicon Processing for the VLSI Era; vol. 4; Deep-Submicron Process Technology; Chapter 9: Shallow Trench Isolation; Lattice Press; pp. 433-474; May 1, 2002.

International Search Report; International Application No. PCT/EP2010/066642; Feb. 2, 2011; European Patent Office.

* cited by examiner

METHOD FOR PRODUCING SILICON SEMICONDUCTOR WAFERS COMPRISING A LAYER FOR INTEGRATING III-V SEMICONDUCTOR COMPONENTS

FIELD OF THE INVENTION

The invention relates to the production of silicon semiconductor wafers having (patterned) III-V semiconductor layers in the context of silicon CMOS process technology, and in particular also to group III nitride layers (for example GaN, AlN or InN), and thus to the monolithic integration of III-V semiconductor elements with silicon semiconductor devices or components by using these silicon wafers with the possibility of combining Si-based logic and individual III-V components for high-voltage, high-power and optoelectronic applications.

BACKGROUND OF THE INVENTION

The pure deposition or formation of layers of group III nitride layers on silicon wafers having in particular a (111) orientation by using buffer layers is described in DE 102 06 750 A1, DE 102 19 223 A1 and WO 2008 132204 A2. These cases deal with blanket depositions without any patterning and exposure of the initial Si surface. The big challenge of the method is to avoid layer stress caused by the different lattice constants and structure by using appropriate buffer layers such that cracks within the layers and an increase of lattice defects, respectively, are avoided.

SUMMARY OF THE INVENTION

WO 2006 138378 A1, US 2006/0284247 A1 and U.S. Pat. No. 7,420,226 B2 disclose a bonded multilayer wafer that is used to integrate the silicon CMOS technology with III-V semiconductors on a single wafer. The multilayer wafer consists of a substrate wafer of a material having a high thermal conductivity (for example SiC or diamond) having formed thereon continuous layers: a single-crystalline layer (for example (111) oriented silicon), formed thereon the III-V layer (for example AlGaN/GaN), followed by a passivation layer (for example formed from nitride), followed by a silicon layer. In a first area CMOS transistors are formed in the silicon layer, in a second area the silicon layer is etched away and for example a High Electron Mobility Transistor (HEMT) is formed in the lower lying exposed III-V layer.

US 2007 0105274 A1 (or US 2007 0105335 A1 and US 2007 0105256 A1) disclose that further single-crystalline semiconductor and insulator layers are applied to the silicon substrate wafer. This multilayer wafer is produced by bonding. There are also shown structures in which different semiconductor materials are present on the surface of different regions. As an example it is referred to FIG. 8 of this document, in which the multilayer wafer consists of silicon areas and single-crystalline semiconductor areas at the surface, wherein these areas are separated from each other by insulator layers. In FIG. 9 of this document a manufacturing method is described, which initially uses a multilayer wafer as a starting wafer, subsequently forms silicon components in a first area (however only by so-called Front End steps, i.e. process steps up to the contact level without metallisation), thereafter etches a second area into the depth down to a crystalline semiconductor layer and re-fills the produced cavity by an epitaxially grown single-crystalline semiconductor layer. Thereafter the Front End process steps for structures in the single-crystalline semiconductor layer and the Back End steps (application of the metallisation) follow.

FIG. 8 of US 2007 0105274 A1 was taken as prior art of FIG. 1 of the present application. The semiconductor assembly shown as a structure consists of two areas 18 and 19 and uses a multilayer wafer as starting material. The first area 18 consists of a single-crystalline silicon layer 14 that has been deposited above an insulation layer 13. Under the insulation layer 13 there are a single-crystalline semiconductor layer 12 (consisting of a germanium layer and/or a silicon-germanium layer) and a silicon substrate layer 11. The second area consists of a second single-crystalline semiconductor layer 16 and 17 that is formed on an area section 12a of the single-crystalline semiconductor layer 12. The two areas 18 and 19 are insulated from each other by an insulation layer 15 (oxide, nitride or a combination thereof).

Continuous layers on a substrate, for example substrates formed from single-crystalline silicon, having expansion coefficients deviating from those of the substrate, as are used in the known methods, involve difficulties during the fabrication of the layer configuration, which are caused by the elastic stress of the layer assembly and the risk of the generation of structure stacking faults in the active single-crystalline semiconductor layer, thereby resulting in degradation of the characteristic data, yield loss and a reduction of the reliability of the components fabricated in the faulty layers, in addition to the increased efforts in terms of processes and materials.

Starting from this prior art it is an object of the present invention to configure an improved method for producing semiconductor wafers and components based on silicon with III-V layer structures for integrating III-V semiconductor components such that drawbacks of the prior art will be overcome, and in particular a method for producing structures should be provided that enables a substantially defect-free growth of III-V semiconductor materials on a specific area or region of a silicon wafer, which is to be processed by, for instance, CMOS technology or which is already partially processed. A planar or substantially planar surface and an electric insulation of the III-V semiconductor component with respect to the remaining wafer are intended. On the one hand an influence on or damaging of the III-V layers by silicon process steps, for example CMOS steps, and, on the other hand, damaging of silicon structures by the III-V process steps are to be avoided.

In order to allow cost-effective production the integration may also be accomplished for wafer diameters of 6 inch and greater as are usually applied for the silicon technology, for instance, for the CMOS technology. In this manner, advanced manufacturing tools available also for these wafer diameters may be used for the manufacturing process.

According to one aspect of the present invention the above object is solved by means of to a method for producing semiconductor wafers (claim 1). In this case, the semiconductor wafer comprises an active silicon layer and at least one III-V layer for integrating III-V semiconductor components with silicon semiconductor components by applying a silicon process technology. In the method an SOI silicon wafer having a buried insulation layer and an active silicon layer formed thereon is used, wherein one or more first and one or more second areas of the active silicon layer are formed by the buried insulation layer and a trench isolation so as to be electrically insulated from each other. The first (insulated) area of the active silicon layer is covered with a mask and a cavity is formed in the second area of the active silicon layer by using the mask as an etch mask. A single-crystalline III-V layer is formed in the cavity by a selective epitaxy technique in the presence of the mask.

According to the present invention the technical problem is therefore solved in this aspect such that one starts from an SOI wafer (silicon on insulator) as a starting material. In this case the buried insulation layer, for example a silicon dioxide layer, serves as a vertical insulation. A horizontal insulation of the various areas of the active layer is obtained by the presence of the trench isolation. By combining the vertical insulation (the buried insulation layer) with the horizontal insulation (the isolation trenches or their insulating filling, respectively) thus areas of the wafer may specifically be electrically insulated with respect to each other. In this manner the areas, in which III-V semiconductor elements are to be formed, may be determined in their lateral position and size by silicon technology without additional process steps. By a specific dimensioning of these areas the stress caused by the application of the III-V layer(s) may be maintained at a low level, since material is grown at the required locations only.

The deposition of the at least one III-V semiconductor layer occurs at least in a specific area only, for example by MOCVD methods, wherein silicon is the substrate base, that is, the "template" for the selective epitaxy growth of the III-V semiconductor layer. Other areas in the silicon, in which a deposition is not to be accomplished, are covered by the mask, for example in form of an oxide layer and/or a nitride layer, or by the isolation trenches.

In one embodiment the cavity extends laterally to the (horizontal) trench isolation such that a precisely defined lateral size of the area for the III-V semiconductor is achieved already by the manufacturing process for the trench without requiring a corresponding precise alignment during the lithography required for producing the mask.

The used silicon materials have an appropriate crystallographic surface orientation, for to example a (100) or a (111) orientation, whereby an adaptation is achieved as an appropriate template material (substrate base) and/or as a base material appropriate for the silicon process. The cavity may be etched by means of an isotropically acting etchant, if an appropriate stop layer is present at the bottom of the cavity and a lateral etch rate is restricted by the isolation trenches. To this end a plurality of plasma assisted etch processes with comparable vertical and lateral etch rate or also wet chemical etch processes for etching silicon are available.

The cavity may be formed such that it terminates in the active silicon layer (claim 7). In this manner relatively short etch times are realised. Moreover, advantageous characteristics of silicon may also be exploited for the III-V areas. In some illustrative embodiments the cavity is additionally or alternatively laterally surrounded or enclosed by material of the active silicon layer of the first area (claim 1) so that, if desired, a lateral embedding of the III-V material is achieved, for instance with respect to the thermal conductivity characteristics.

In illustrative embodiments the cavity is formed by means of an etch process, which comprises at least one crystallographically anisotropically acting etch step (claim 9). In this manner the etch process may precisely be controlled and, compared to the surface orientation, different crystal planes may be provided as growth planes for the selective epitaxy. The cavity may be formed such that {111} oriented side faces are formed in the cavity (claim 10).

In further embodiments the cavity is formed such that it extends through the buried insulation layer and terminates in or on a crystalline semiconductor material, on which the buried insulation layer is formed (claim 7, claim 11). By this approach different crystallographic surface orientations may be used for the crystalline substrate material and the active layer such that an appropriate crystalline growth is obtained for the III-V layer(s), while at the same time the appropriate orientation for the silicon technology may be selected for the active silicon layer.

The III-V layer may grow as a single layer or as a layer stack with two or more III-V sub layers (claim 12) in order to obtain the desired electronic and crystal characteristics. The III-V layer may advantageously be provided as a III-nitride layer, that is, as a nitrogen-containing layer, as it is advantageous for many optoelectronic applications (claim 13).

In a further aspect the above-indicated object is solved by a method for producing to semiconductor elements in an active silicon layer and in a III-V layer. The method comprises the usage of a substrate having a buried insulation layer formed above a crystalline substrate material and an active silicon layer comprising electrically insulated areas and being formed on the buried insulation layer. Isolation trenches effect this electrical insulation of said areas. A first area of the active silicon layer that is not to be etched is covered with a mask, and a cavity is formed in a second area that is not covered by the mask. A single-crystalline III-V layer is formed in the cavity by a selective epitaxy process, and a III-V semiconductor component is formed in the second area and a silicon semiconductor component is formed in the first area by using silicon process technology.

In illustrative embodiments the cavity may be formed such that it extends to the crystalline substrate material, while in other cases the cavity terminates in the active silicon layer above the buried insulation layer or ends in the depth. Also the above identified embodiments may also be advantageously used for the fabrication of a semiconductor wafer.

Further advantages embodiments are defined in the dependent claims and also in the following detailed description.

BRIEF DESCRIPTION OF THE DRAWINGS

The invention is now explained by referring to embodiments using the schematic cross-sectional drawings. In the drawings

DETAILED DESCRIPTION OF THE INVENTION

Figure 1:
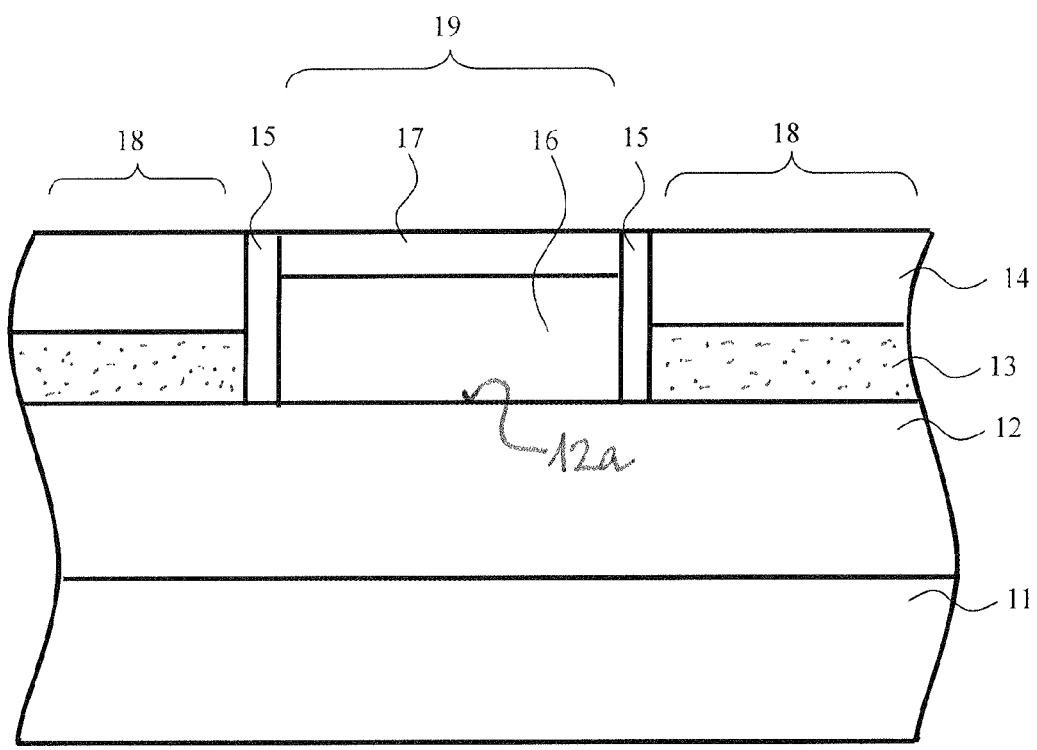
FIG. 1 shows a layer assembly of a semiconductor wafer in cross-sectional view according to the prior art.
Figure 2:
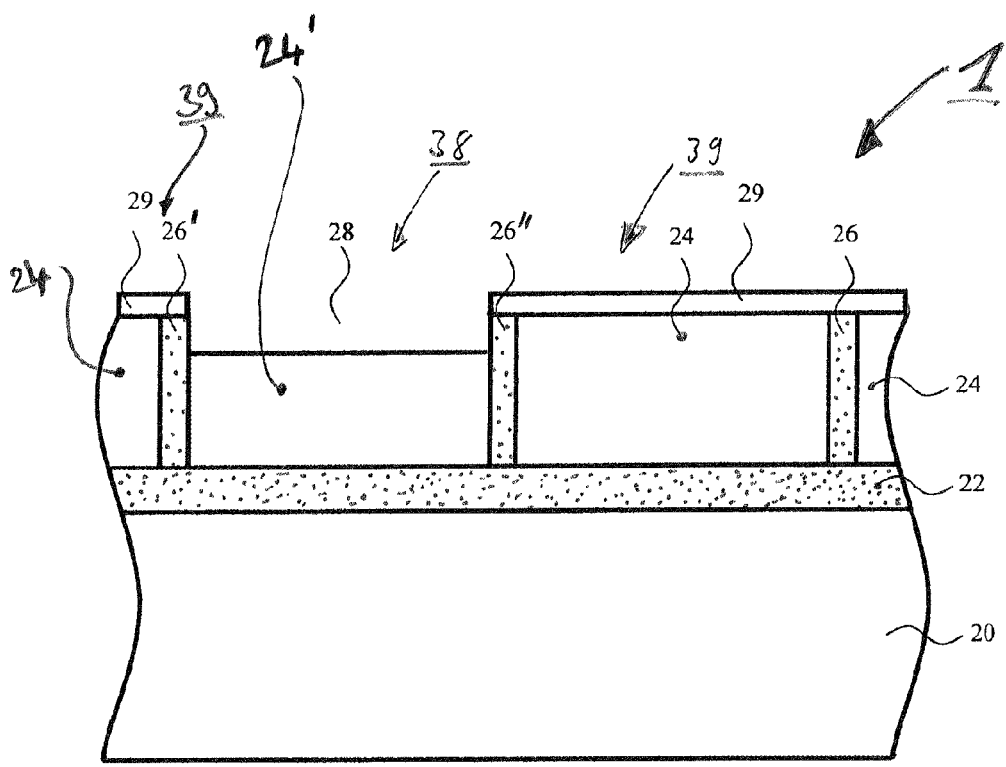
FIG. 2 shows a cross-sectional view of a layer assembly of a semiconductor wafer as an intermediate step for producing a III-V semiconductor layer that is grown in an electrically insulated to area 38 of an active silicon layer.

FIG. 2 shows a first embodiment. Starting point as an SOI wafer 1, consisting of a silicon carrier wafer 20 (briefly denoted as: carrier or substrate), which is also denoted as crystalline substrate material and comprises an appropriate crystalline configuration, a buried insulation layer, for instance an oxide layer 22, and an active silicon layer 24, which also has an appropriate crystalline configuration that may be identical to or different from the crystalline configuration of the substrate material 20.

Generally the crystalline configuration is indicated on the basis of the crystalline orientation of a surface of the carrier 20 or of the active layer 24. The surface of these materials (and thus any parallel cross-section thereof) corresponds to a (certain) crystal plane or to a physically equivalent plane. For example a (100) surface orientation is to be understood such that the surface corresponds to a (100) plane so that for a cubic shape of the unit cell in silicon a <100> orientation is perpendicular to the surface. Furthermore, the orientation of the wafer is such that typically the transistors and other components are oriented along a <100> or <110> crystal axis. In a corresponding orientation there are also (100) or (110) planes as boundary faces for perpendicularly etched trenches or cavities when they are arranged according to the alignment of the transistors in the above sense.

By incorporating isolation trenches 26, 26' or 26" the active layer 24 is divided into individual areas, for example a first area 38 and a second area 39 that are electrically insulated from each other. A plurality of such insulated areas may be provided. The isolation trenches may be formed in a desired "silicon technology" in which trenches are etched in the active layer 24 for laterally dividing the layer into active areas and in which the trenches are then filled with at least a partially insulating material. By this measure also the areas 38 and 39 are formed with an appropriate lateral size by this silicon process technique, as is required for the silicon components (transistors and the like) and for the III-V semiconductor components (transistors of increased mobility, opto-electronic components in the form of LEDs and laser diodes).

In selected areas, that is, in the embodiment illustrated, in the area 39, a mask 29, for instance an oxide mask, a nitride mask or the like is formed by usual process steps of a desired silicon process technology, such as CVD layer deposition, photomask processing, plasma etching or reactive ion etching, respectively, removal of the photo resist mask, wherein only specific areas, here the area 38, are exposed by etching. Other areas, i.e. the area 39 and, if required, the isolation trenches remained masked. In the exposed areas 38 a part of the silicon layer 24 may be removed by etching without any further masking steps by using the mask 29, thereby creating a cavity 28 in which one or more desired III-V semiconductor layer(s) are grown in a later phase. There remains the rest 24' in the area 38. The cavity 28 is formed above the rest 24'.

Figure 3:
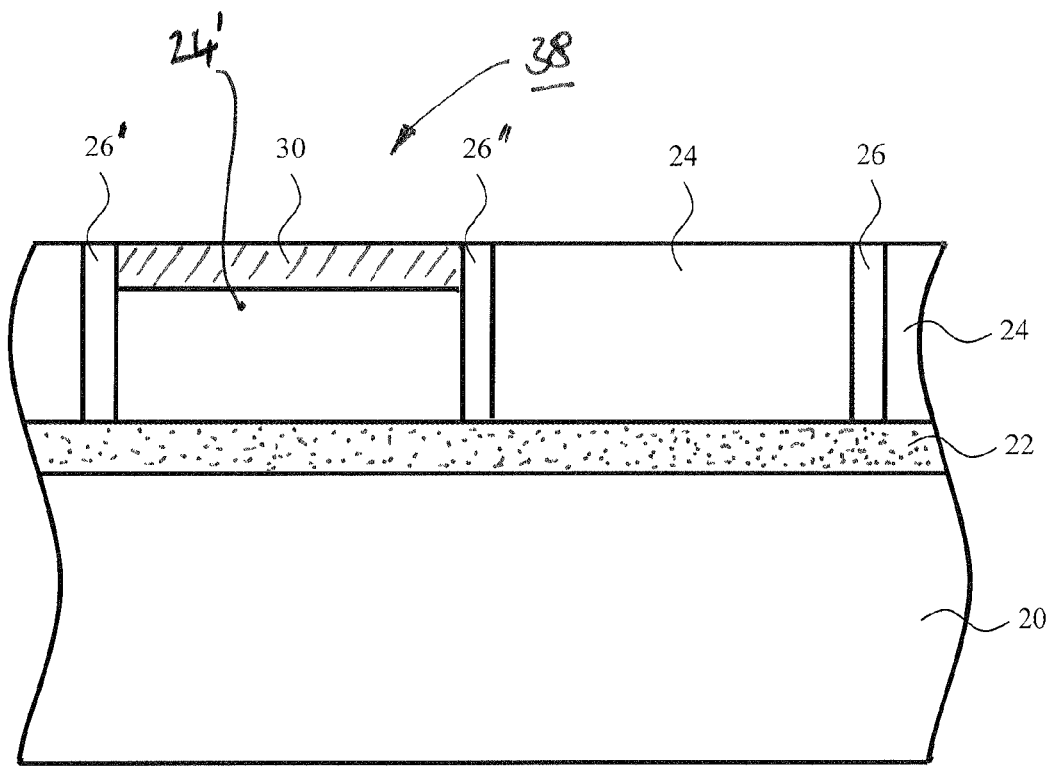
FIG. 3 shows a layer assembly according to FIG. 2 after completing the III-V semiconductor layer 30.

FIG. 3 depicts the semiconductor wafer 1 after an epitaxy step, for instance by a MOCVD (metal-organic CVD) process, by which a III-V semiconductor layer 30 is formed within this epitaxy cavity 28. The epitaxy process used is a selective method, in which the layer growth occurs on the exposed crystalline silicon surface only with no growth on the mask 29 and on the insulating material (for example the silicon oxide) of the side faces of the isolation trenches 26' and 26". Hence, a selective and defect-depleted epitaxy may be obtained at the bottom of the epitaxy cavity 28. Since in the embodiment shown the cavity 28, whose side faces do not act as growth faces due to the selectivity of the deposition process, extends laterally to the isolation trenches 26, the layer 30 that may also be grown as a layer stack of several layers may be formed by using the surface orientation of the remaining active layer 24'.

By tuning the depth of the epitaxy cavity 28 with respect to the required layer thickness of the III-V semiconductor layer 30 a planar surface is formed, if required.

After the removal of the oxide mask 29 the structure is obtained as illustrated in FIG. 3. In other areas of the active layer 24 usual silicon components, for instance CMOS transistors, diodes, resistors, and the like, may be placed. The electrically insulated III-V semiconductor layer 30 may be provided, for example, as a $Al_xGa_{1-x}N/GaN$ hetero-layer and may form the basis for an electrically insulated High Electron Mobility Transistor (HEMT).

Figure 4:
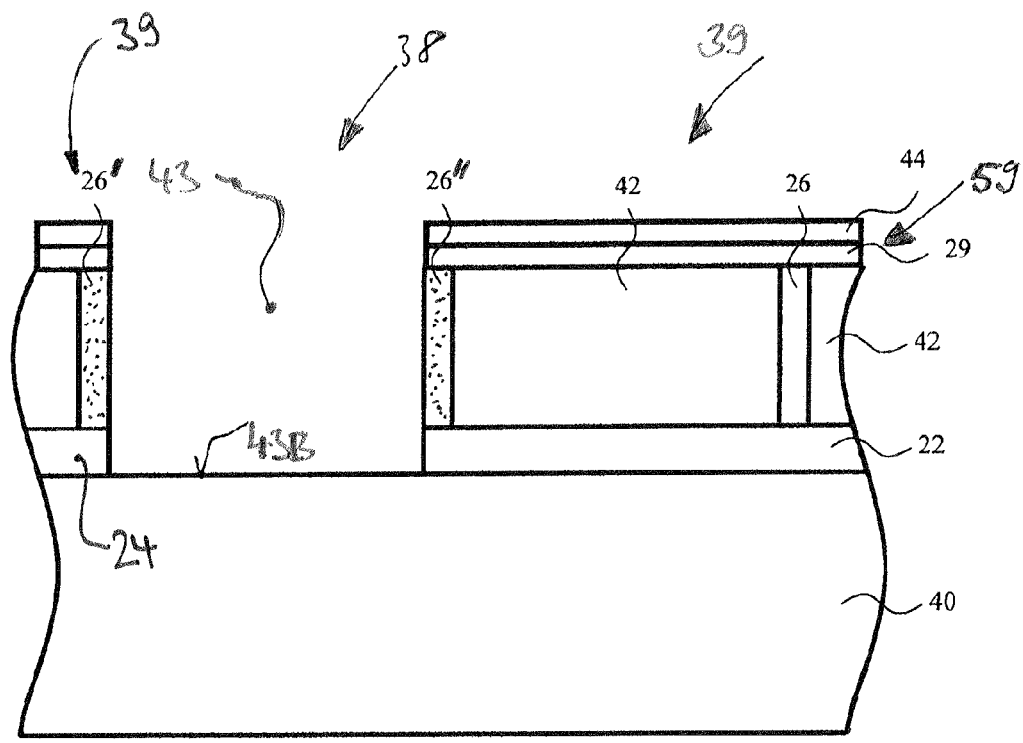
FIG. 4 shows a cross-sectional view of a layer assembly of a semiconductor wafer as an intermediate step for producing a III-V semiconductor layer that is to be grown in an electrically insulated area within which the surface of the substrate wafer is exposed by means of a cavity 43 formed by etching.
Figure 5:
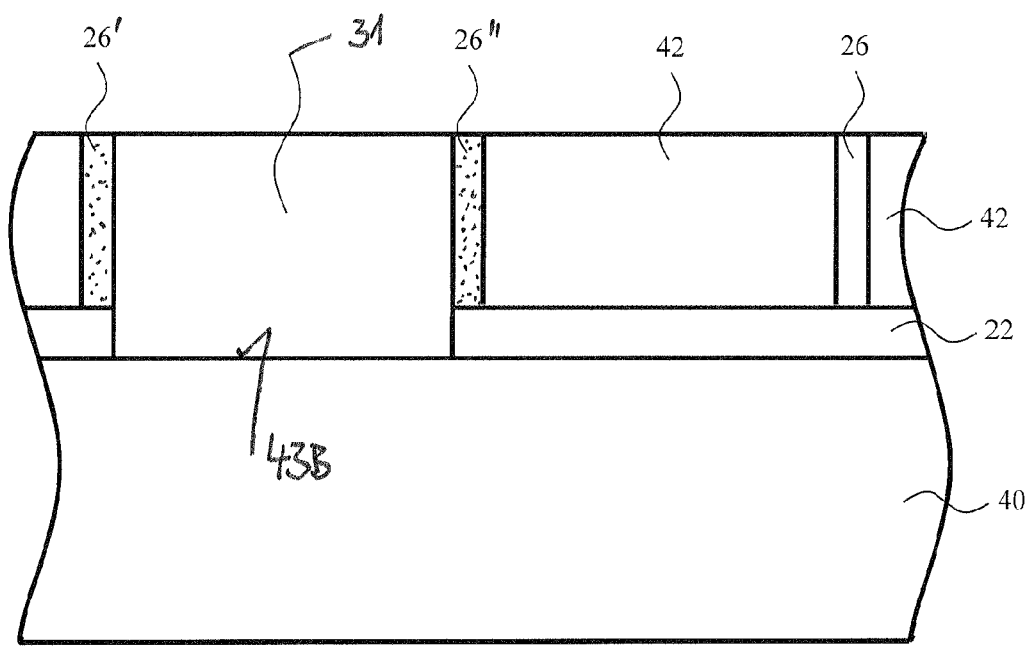
FIG. 5 shows the layer assembly according to FIG. 4 after completing the III-V semiconductor layer 31 grown on the silicon substrate.

A further embodiment is shown in FIGS. 4 and 5. Due to the superior lattice adaptation a (111) oriented silicon is preferred as substrate material for the growth of the III-V semiconductor layer. For the area of CMOS technology, however, a (100) oriented silicon is advantageous. This may be realised by using a (111) oriented silicon carrier wafer 40 or a crystalline substrate material having a (111) orientation that are formed on an appropriate carrier material, and by using a (100) oriented active silicon layer 42, wherein both layers are vertically isolated from each other by the buried insulation layer 22.

Within the area 38 delineated by the isolation trenches 26' and 26' the (100) oriented active silicon layer 42 is completely removed by etching by using a mask 59 that is composed of the oxide mask 29 and a nitride mask 44 in the embodiment shown. Also the exposed part of the buried oxide 22 is removed by etching. Thus, the epitaxy cavity 43 is formed whose bottom 43B consists of the (111) oriented silicon carrier wafer 40 and whose walls consist of the oxide of the isolation trenches 26' and 26" and of the insulation layer 22.

As is shown in FIG. 5 a III-V semiconductor layer 31 may be selectively formed within the epitaxy cavity 28 after the removal of the nitride mask 44, since the layer growth occurs only on the exposed part of the (111) oriented silicon carrier wafer 40 and does not occur on the oxide mask 29 and on the silicon oxide of the sidewalls of the isolation trenches 26 and on the insulation layer 22.

After the removal of the oxide mask 29 the structure is obtained as depicted in FIG. 5. By adapting the thickness of the silicon layer 42 and the thickness of the buried oxide 22 to the required layer thickness of the III-V semiconductor layer 30 a planar surface is created. In the areas of the active silicon layer 42 usual silicon components, for example CMOS transistors, diodes, resistors, and the like may be placed. The electrically insulated III-V semiconductor layer 30 may be provided, for example, as an $Al_xGa_{1-x}N/GaN$ hetero-layer and may form the basis for an electrically insulated High Electron Mobility Transistor (HEMT).

In alternative embodiments the mask 59 may completely be formed from nitride as long as the process parameters of the selective epitaxy also result in a substantially zero deposition rate on silicon nitride. In this manner, the mask 59 may act as an etch mask and a deposition mask, wherein the removal thereof may be accomplished selectively with respect to any oxide material.

Figure 6:
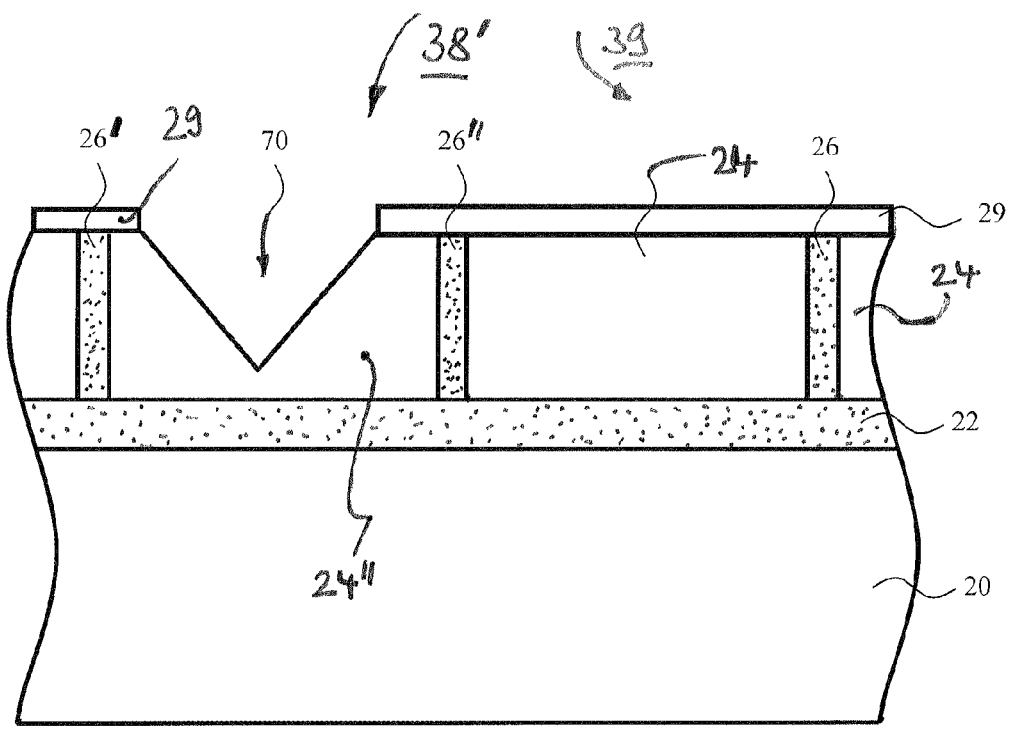
FIG. 6 shows a cross-sectional view of a layer assembly of a semiconductor wafer as an intermediate step for producing a III-V semiconductor layer that is to be grown in an electrically insulated area of the active silicon layer, which comprises two {111} oriented side faces as crystallographically (100) oriented layers formed by an alkaline etching.
Figure 7:
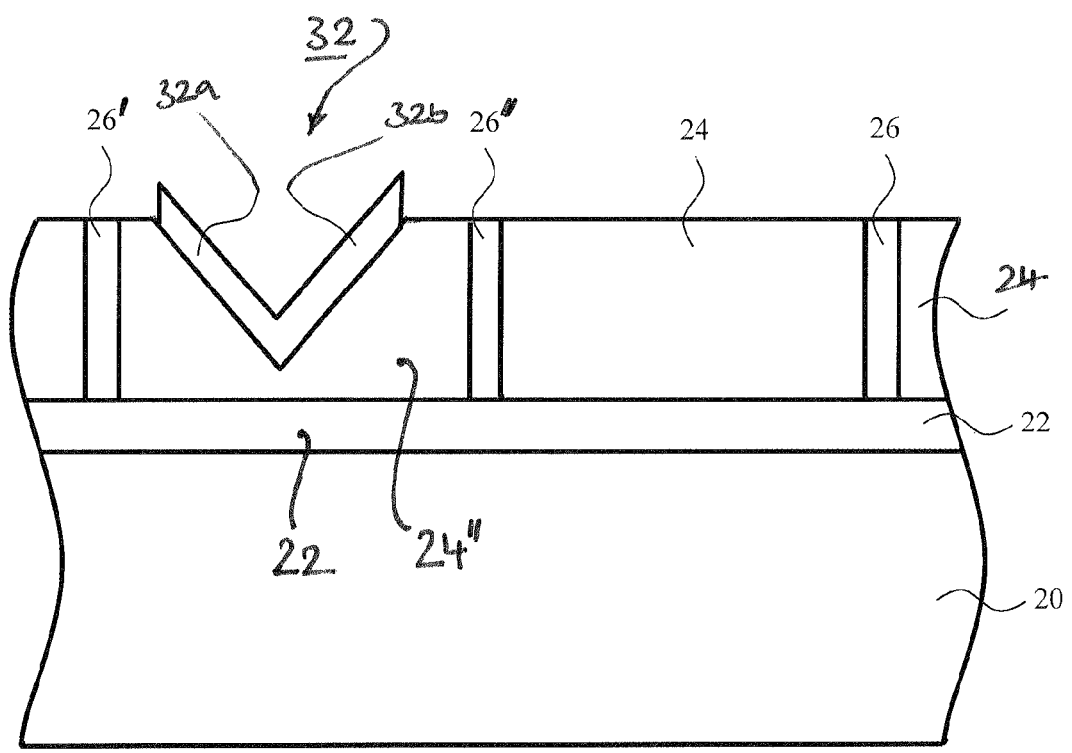
FIG. 7 shows the layer assembly according to FIG. 6 after completing the III-V semiconductor layer 32 grown on the {111} oriented side faces.

A third embodiment is shown in FIGS. 6 and 7. Starting point is an SOI wafer consisting of the silicon carrier wafer 20, the buried oxide layer 22 and the (100) oriented active silicon layer 24. By means of the incorporation of the isolation trenches 26 the active silicon layer 24 is divided into 2-dimensional areas 38, 39, which are electrically insulated from each other, as is also discussed above. In selected areas, i.e. in this case the area 39, the mask 29 is formed such that only a specific area 38' is exposed by etching. In the illustrated example the mask 29 also covers a part of the earlier area 38 shown in FIG. 4 such that a cavity 70 is created in the area 38', which cavity is laterally enclosed by material of the remaining layer 24" and wherein the cavity 70 terminates in the layer 24.

In the embodiments described above the etching of the form cavity is effected by isotropically acting etch processes for example by plasma-based processes or wet chemical processes, in which the lateral etch rate is approximately equal to the vertical etch rate, wherein, however, due to the etch selectivity the lateral dimension of the cavity formed is determined by the isolation trenches 26', 26" and the buried insulation layer, respectively.

In the example of FIG. 6, in which the lateral dimension of the cavity 70 is to be restricted such that it is embedded in the layer 24, wherein this may be accomplished by using an anisotropic etch process. For a boundary of the cavity 70 with steep flanks a plasma assisted anisotropic recipe may be used for this purpose, in which case many well known etch recipes are available for silicon. In the embodiment shown the etching of the cavity 70 is achieved by a strongly (crystallographically) anisotropically acting etch medium, for instance potassium hydroxide (KOH), TMAH (tetramethyl ammonium hydroxide), which has different etch rates for different crystal orientations. In the example shown the cavity 70 is delineated by {111} faces of the remaining active silicon layer 24", which faces are advantageous for forming thereon the III-V semiconductor.

In other embodiments various etch techniques may be combined in order to obtain an appropriate shape of the cavity 70 or of the cavities and 29 or 43. For example, a plasma-based process, isotropic or anisotropic, may be performed first and thereafter a crystallographically anisotropic process may be applied, or isotropic and anisotropic wet chemical processes may be combined.

In a subsequent epitaxy step, for example an MOCVD process, a III-V semiconductor layer 32 may be formed within the anisotropic epitaxy cavity 70, since the layer growth occurs on the exposed {111} faces only and not on the mask 29. The layer 32 may comprise two sections 32a, 32b that are oppositely inclined to each other, and are therefore not planar.

By using isolation trenches the active silicon layer 24 is divided into individual areas that are electrically insulated from each other. Therefore the III-V semiconductor 32, for example an $Al_xGa_{1-x}N$ HEMT, and the silicon of the active silicon layer 24 may be at different electric potentials.

In a further embodiment semiconductor wafers comprising III-V layer structures, in the special case of group III nitride layer structures, for integrating III-V semiconductor components with silicon semiconductor components are formed by using the silicon CMOS process technology with the following sequence of process steps. In this case, an SOI silicon wafer 1 is used that has areas 38, 39 of the active silicon layer 24, 42 electrically insulated from each other by isolation trenches 22, 26. Certain areas of the active silicon layer 24 or 42, which are not to be etched, are masked by etch passivation layer(s) and etch cavities 28 or 43 or 70 are formed, namely in the electrically insulated area (s) of the active silicon layer that are not masked by the etch passivation layer(s). Finally a single-crystalline III-V layer is formed in the respective cavity by a MOCVD process.

In a variant of this method the active silicon layer 24 has a crystallographic (100) orientation and the cavity 28 is etched with an isotropically acting etchant.

In a further variant the active silicon layer 24 has a crystallographic (100) orientation and the cavity 70 is etched with an anisotropically acting etchant, wherein {111} oriented (inclined) side faces are formed in the cavity 70.

In a further variant the active silicon layer 24 has a crystallographic (111) orientation and the cavity 28 is etched with an isotropically acting etchant.

In a further variant a sequence of layers of a plurality of III-V layers is formed in the cavity.

In a further embodiment the method for producing a silicon semiconductor wafer having III-V layers, in the special case of group III nitride layers, for integrating III-V semiconductor components with silicon semiconductor components by using the silicon CMOS process technology comprises the following process steps: using an SOI silicon wafer 1 that comprises a substrate wafer 20 and areas 38, 39 of the active silicon layer 42 with (100) orientation and being electrically insulated from each other by insulation layers 22, 26; covering certain areas of the active silicon layer 42, which are not to be etched, by means of an etch mask 59 consisting of an $SiO_2$ layer 29 and a nitride layer 44; forming an etch cavity 43 in a certain electrically insulated area of the active silicon layer 42 not covered by the etch mask by completely removing the active silicon layer 42 and the vertically insulating buried oxide 22 within the cavity that extends to the surface of the substrate silicon wafer; forming a single-crystalline III-V layer 31 in the cavity 43 by a MOCVD technique.

In a further variant of this method the substrate 40 has a crystallographic (111) orientation and the cavity 43 is etched with an isotropically acting etchant.

In a further variant the substrate has a crystallographic (100) orientation and the cavity 43 is firstly etched with an isotropically acting etchant and thereafter is etched with an anisotropically acting etchant for forming {111} oriented side faces.

In a further variant a sequence of layers including a plurality of III-V layers is formed in the cavity 43.

The invention claimed is:

1. A method for producing a semiconductor wafer having an active silicon layer and at least one III-V layer (30, 31, 32) configured to integrate components formed from III-V semiconductor material and silicon by using a silicon process technology comprising:
    providing an SOI silicon wafer (1) with a buried insulation layer (22) and an active silicon layer (24, 42) formed thereon, wherein at least a first (39) and at least a second (38) area of the active silicon layer (24, 42) being electrically insulated from each other are formed by the buried insulation layer (22) and a trench isolation (26; 26', 26");
    covering the first insulated area (39) of the active silicon layer (24, 42) with a mask (29, 59);
    forming a cavity (28, 43, 70) in the second area (38) of the active silicon layer (24, 42) by using the mask (29, 59) as an etch mask, wherein the cavity is formed to extend through the buried insulation layer (22) and terminate in or on a crystalline semiconductor material whereon the buried insulation layer is formed; and
    forming at least one single-crystalline III-V layer (30, 31, 32) in the cavity (28, 43, 70) by a selective epitaxy process in the presence of the mask (29, 59).

2. The method of claim 1, wherein the cavity (28, 43, 70) extends laterally to the trench isolation (26', 26"), which comprises a vertical trench isolation.

3. The method of claim 1, wherein the active silicon layer (24) has a crystallographic {100} or {111} surface orientation.

4. The method of claim 2, wherein the cavity (28) is etched with an isotropically acting etchant.

5. The method of claim 1, wherein the cavity is formed by a plasma assisted etch process.

6. The method of claim 5, wherein the plasma assisted etch process has a lateral etch rate that is less than a vertical etch rate.

7. The method of claim 1, wherein the cavity (28, 43) is laterally enclosed by a material of the active silicon layer of the first area (39).

8. The method of claim 7, wherein the cavity is formed by an etch process comprising at least a crystallographically anisotropically acting etch step.

9. The method of claim 8, wherein the cavity is formed such that {111} oriented side faces are formed in the cavity (70).

10. The method of claim 1, wherein the III-V layer comprises at least two III-V sub layers as a sequence of layers.

11. The method of claim 1, wherein the III-V layer comprises nitrogen.

12. A method for producing semiconductor elements in an active silicon layer and at least one III-V layer (30, 31, 32) comprising:
   using a substrate (20, 40) having a buried insulation layer (22) formed above a crystalline substrate material (20, 40) and having an active silicon layer (24, 42) formed on the buried insulation layer (22) and comprising areas (38, 39) electrically insulated from each other by isolation trenches (26', 26");
   covering a first area (39) of the active silicon layer (42) not to be etched by a mask (29, 59);
   forming a cavity (29, 43, 70) in a second area (38) not being covered by the mask (29, 59);
   forming a single-crystalline III-V layer (30, 31, 32) in the cavity (29, 43, 70) by a selective epitaxy method, wherein the cavity is formed such that it extends to the crystalline substrate material; and
   forming a III-V semiconductor component in the second area (38) and a silicon semiconductor component by using a silicon process technology in the first area (39).

13. The method of claim 12, wherein the crystalline substrate material (20, 40) and the active silicon layer (24, 42) have a different surface crystallographic orientation.

14. The method of claim 13, wherein the active silicon layer has a {100} surface orientation and the crystalline substrate material has a {111} surface orientation.

15. The method of claim 14, wherein the cavity (43) is etched with an isotropically acting accent.

16. The method of claim 12, wherein the crystalline substrate material has a crystallographic {100} surface orientation and the cavity (43) is first etched with an isotropically acting etchant and is subsequently etched with an anisotropically acting etchant to form {111} oriented side faces.

17. The method of claim 12, wherein a sequence of layers including a plurality of III-V layers is formed in the cavity (43).

18. The method of claim 12, wherein the silicon semiconductor component is formed by a CMOS process.

19. The method of claim 3, wherein the cavity (28) is etched with an isotropically acting etchant.

* * * * *